United States Patent [19]
Tanaka et al.

[11] Patent Number: 6,081,016
[45] Date of Patent: Jun. 27, 2000

[54] CMOS DEVICE WITH IMPROVED WIRING DENSITY

[75] Inventors: Kazuo Tanaka, Sakata; Takashi Kumagai, Chino; Junichi Karasawa, Tatsuno-machi; Kunio Watanabe, Sakata, all of Japan

[73] Assignee: Seiko Epson Corporation, Tokyo, Japan

[21] Appl. No.: 09/282,035

[22] Filed: Mar. 30, 1999

[30] Foreign Application Priority Data

Mar. 31, 1998 [JP] Japan ................................. 10-103844
Mar. 2, 1999 [JP] Japan ................................. 11-054375

[51] Int. Cl.[7] ........................... H01L 29/76; H01L 29/94; H01L 31/062; H01L 31/113; H01L 31/119
[52] U.S. Cl. ......................... 257/377; 257/369; 438/199; 438/219
[58] Field of Search ..................................... 257/369, 377, 257/380, 390, 903; 438/199, 219, 218, 225, 233, 271–281

[56] References Cited

U.S. PATENT DOCUMENTS

| | | | |
|---|---|---|---|
| 5,254,874 | 10/1993 | Malwah | 257/754 |
| 5,294,822 | 3/1994 | Verrett | 257/368 |
| 5,298,782 | 3/1994 | Sundaresan | 257/393 |
| 5,309,010 | 5/1994 | Kitajima | 257/347 |
| 5,619,056 | 4/1997 | Kuriyama et al. | 257/369 |
| 5,880,502 | 3/1999 | Lee et al. | 257/372 |
| 5,981,320 | 11/1999 | Lee | 438/199 |

*Primary Examiner*—Tom Thomas
*Assistant Examiner*—Douglas W. Owens
*Attorney, Agent, or Firm*—Hogan & Hartson LLP

[57] ABSTRACT

A method of manufacturing a semiconductor device comprising the following steps: forming first, second, and third wiring layers on a semiconductor substrate; forming first, second, and third cover dielectric layers for covering these wiring layers; forming a first impurity diffusion layer of a P type and a second impurity diffusion layer of an N type in an active region, and forming a third impurity diffusion layer of a P type and a fourth impurity diffusion layer cf an N type in an active region; self-alignably forming a first local wiring layer for connecting the first impurity diffusion layer with the second wiring layer, and self-alignably forming a second local wiring layer for connecting the fourth impurity diffusion layer with the third wiring layer; in an interlayer dielectric layer, self-alignably forming a first contact hole by using the first and third cover dielectric layers as masking layers, and self-alignably forming a second contact hole by using the second cover dielectric layer as a masking layer; and forming fourth and fifth wiring layers in these contact holes, respectively.

7 Claims, 5 Drawing Sheets

CM OS DEVICE WITH IMPROVED WIRING DENSITY

BACKGROUND OF THE INVENTION

1. Field of the Invention

The present invention relates to a semiconductor device and a method of manufacturing the same. More particularly, the present invention relates to a complementary metal oxide semiconductor (CMOS) device and a method of manufacturing thereof.

2. Description of Related Art

As the integration scale of semiconductor integrated circuit design has increased, it has become common practice to provide a large-scale integrated circuit (LSI) which contains a high-speed logic circuit and a large-capacity memory on a single semiconductor chip. For achieving higher speed in semiconductor integrated circuit operation, it is desirable to increase the degree of integration by arranging MOS transistors in a finer structure. For higher integration, an increase in wiring density, i.e., a decrease in average wiring length is also preferable.

In particular, a CMOS cell using six transistors has a relatively large margin of operation and a relatively small current for data retention, and therefore is contained in most CMOS SRAMs at present. However, since the memory cell area of the CMOS SRAM cell is rather large, there is a need to reduce the cell area for improvement in device integration.

SUMMARY OF THE INVENTION

It is therefore an object of the present invention to provide a CMOS device which has higher wiring density for increasing the degree of integration, and a method of manufacturing the same.

According to one aspect of the present invention, there is provided a method of manufacturing a semiconductor device comprising the steps (a) to (h):

(a) forming an active region and an element isolation region in predetermined areas of a semiconductor substrate;

(b) forming first, second and third wiring layers on the active region and element isolation region with a dielectric layer interposed, the first wiring layer connecting a gate electrode of a first load transistor with a gate electrode of a first drive transistor, the second wiring layer connecting a gate transistor of a second load transistor with a gate transistor of a second drive transistor, and the third wiring layer connecting the first wiring layer with an impurity diffusion layer of the second drive transistor;

(c) forming first, second and third cover dielectric layers that continuously cover side and top surfaces of the first, second and third wiring layers, respectively;

(d) forming a first impurity diffusion layer of a first conductive type and a second impurity diffusion layer of a second conductive type in the active region; and forming a third impurity diffusion layer of the first conductive type and a fourth impurity diffusion layer of the second conductive type in the active region;

(e) self-alignably forming a first local wiring layer for connecting the first impurity diffusion layer with the second wiring layer; and self-alignably forming a second local wiring layer for connecting the fourth impurity diffusion layer with the third wiring layer;

(f) forming an interlayer dielectric layer;

(g) self-alignably forming a first contact hole on the semiconductor substrate in a predetermined area of the interlayer dielectric layer by using at least the first and third cover dielectric layers as masking layers to expose a part of each of the first impurity diffusion layer, the third cover dielectric layer, the element isolation region and the second impurity diffusion layer; and self-alignably forming a second contact hole on the semiconductor substrate in a predetermined area of the interlayer dielectric layer by using at least the second cover dielectric layer as a masking layer to expose a part of each of the third impurity diffusion layer, the element isolation region and the fourth impurity diffusion region; and (h) forming a fourth wiring layer in the first contact hole, and a fifth wiring layer in the second contact hole.

At the step (g), the first contact hole can be self-alignably formed in the interlayer dielectric layer (first layer) by using at least the first cover dielectric layer for covering the first wiring layer and the third cover dielectric layer for covering the third wiring layer to provide masking, and the second contact hole can also be formed self-alignably in the interlayer dielectric layer by using at least the second cover dielectric layer to provide masking. Therefore, in a lithographic process in which contact holes are formed, it is not required to take account of an alignment error, leading to improvement in wiring density.

At the step (e), the first impurity diffusion layer a nd the second wiring layer are connected by means of the first local wiring layer that is self-alignably formed without using a contact hole, and the fourth impurity diffusion layer and the third wiring layer are connected by means of the second local wiring layer that is self-alignably formed. In this respect, a degree of device integration can also be improved.

In this method of manufacturing a semiconductor device, the first, second, and third wiring layers formed at the step (b) may contain silicon. These wiring layers may have a doped polysilicon single-layer structure or a polycide structure in which a doped polysilicon layer and a silicide layer are laminated.

The local wiring layer is preferably provided as a metallic silicide layer formed by a salicide (self-aligned silicide) processing technique. More specifically, the first local wiring layer may comprise a metallic silicide layer which is formed by removing a part of the second cover dielectric layer to expose a part of the second wiring layer and then by self-aligning with the exposed surfaces of the first impurity diffusion layer and the second wiring layer. The second local wiring layer may comprise a metallic silicide layer which is formed by removing a part of the third cover dielectric layer to expose a part of the third wiring layer and then by self-aligning with the exposed surfaces of the fourth impurity diffusion layer and the third wiring layer.

According to another aspect of the present invention, there is provided a semiconductor device which comprises a memory cell including first and second load transistors, first and second drive transistors and two transfer transistors, the semiconductor device comprising:

a first wiring layer for connecting a gate electrode of the first load transistor with a gate electrode of the first drive transistor, formed on an active region and an element isolation region, with a dielectric layer interposed;

a first cover dielectric layer for continuously covering side and top surfaces of the first wiring layer;

a first impurity diffusion layer of a first conductive type that is a part of the first load transistor, and a second impurity diffusion layer of a second conductive type that is a part of the first drive transistor, both of which are formed in an active region;

a second wiring layer for connecting a gate electrode of the second load transistor with a gate electrode of the second drive transistor, formed on the active region and element isolation region, with a dielectric layer interposed, apart from the first wiring layer;

a second cover dielectric layer for continuously covering side and top surfaces of the second wiring layer;

a third impurity diffusion layer of the first conductive type that is a part of the second load transistor, and a fourth impurity diffusion layer of the second conductive type that is a part of the second drive transistor, both of which are formed in an active region;

a third wiring layer for connecting the first wiring layer with the fourth impurity diffusion layer, at least a part of the third wiring layer being disposed on the element isolation region;

a third cover dielectric layer for continuously covering side and top surfaces of the third wiring layer;

a first local wiring layer for connecting the first impurity diffusion layer with the second wiring layer;

a second local wiring layer for connecting the fourth impurity diffusion layer with the third wiring layer;

an interlayer dielectric layer including:

a first contact hole which exposes a semiconductor substrate including at least a part of each of the first impurity diffusion layer, third cover dielectric layer, element isolation region, and second impurity diffusion layer; and a second contact hole which exposes the semiconductor substrate including at least a part of each of the third impurity diffusion layer, element isolation region, and fourth impurity diffusion layer;

a fourth wiring layer for connecting the first impurity diffusion layer with the second impurity diffusion layer, formed in the first contact hole; and a fifth wiring layer for connecting the third impurity diffusion layer with the fourth impurity diffusion layer, formed in the second contact hole.

The semiconductor device mentioned above can be applied to a full CMOS SRAM having six transistors. In this case, each of the first and second wiring layers is a gate wiring layer in a CMOS of a full CMOS SRAM. In an active region, the first load transistor and the first drive transistor are formed. The third wiring layer connects the first gate wiring layer with the impurity diffusion layer of the second drive transistor (fourth impurity diffusion layer). The fourth wiring layer connects the impurity diffusion layer of the first transistor (first impurity diffusion layer) with the impurity diffusion layer of the first drive transistor (second impurity diffusion layer). The fifth wiring layer connects the impurity diffusion layer of the second load transistor (third impurity diffusion layer) with the impurity diffusion layer of the second drive transistor (fourth impurity diffusion layer). In this full CMOS SRAM, the local wiring layers and contact holes are formed self-alignably as mentioned above, making it possible to realize a reduction in cell area.

The third wiring layer may be formed as a continuous layer integrated with the first wiring layer. The continuous wiring layer comprising the first and third wiring layers may be arranged to provide a plane configuration similar to a shape "h", and the second wiring layer may be arranged to provide a plane configuration similar to a shape "7".

DETAILED DESCRIPTION OF THE PREFERRED EMBODIMENTS

Figure 1:
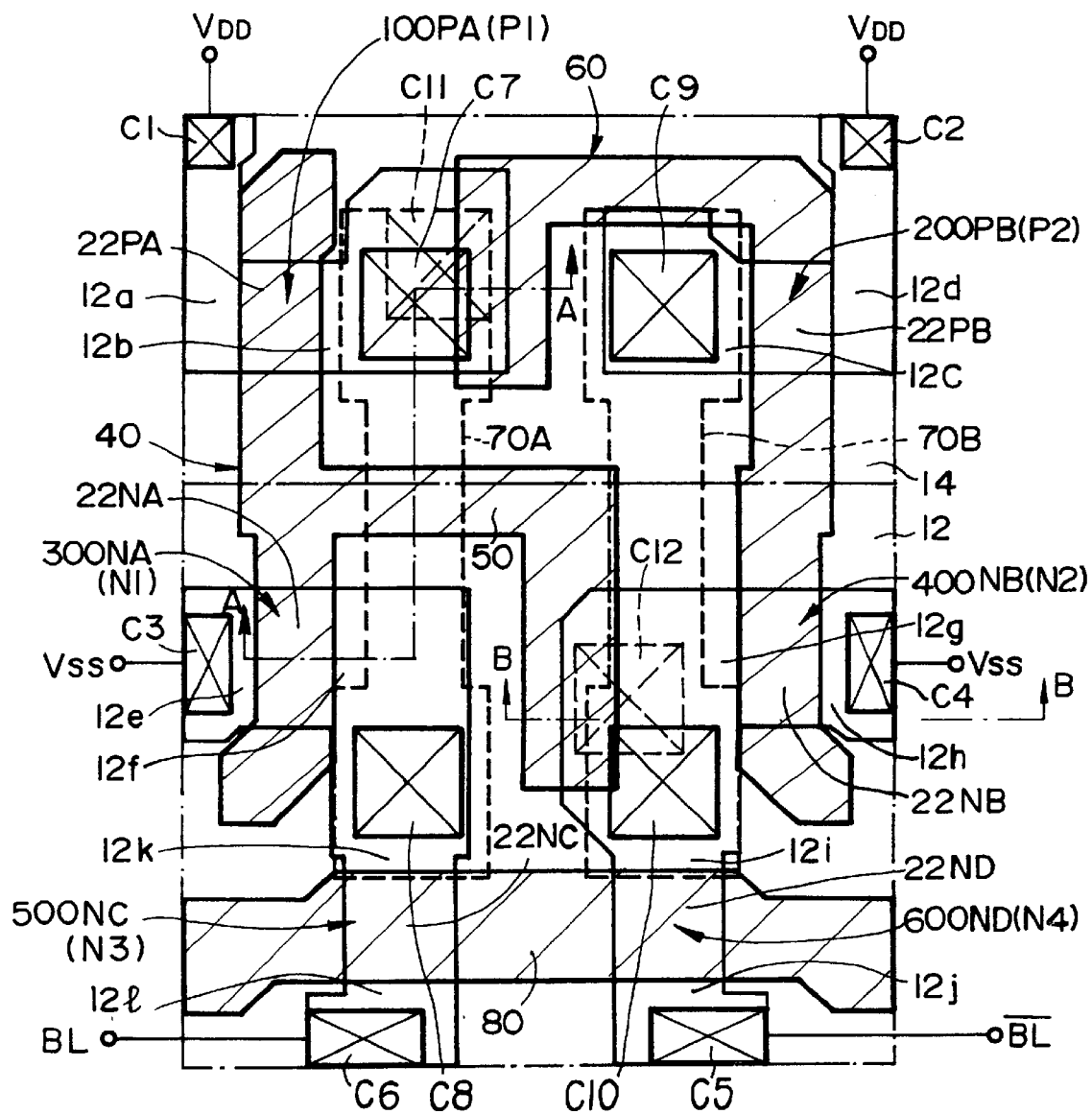
FIG. 1 is a plan view showing a layout of a full CMOS SRAM cell in a preferred embodiment of the present invention.
Figure 2:
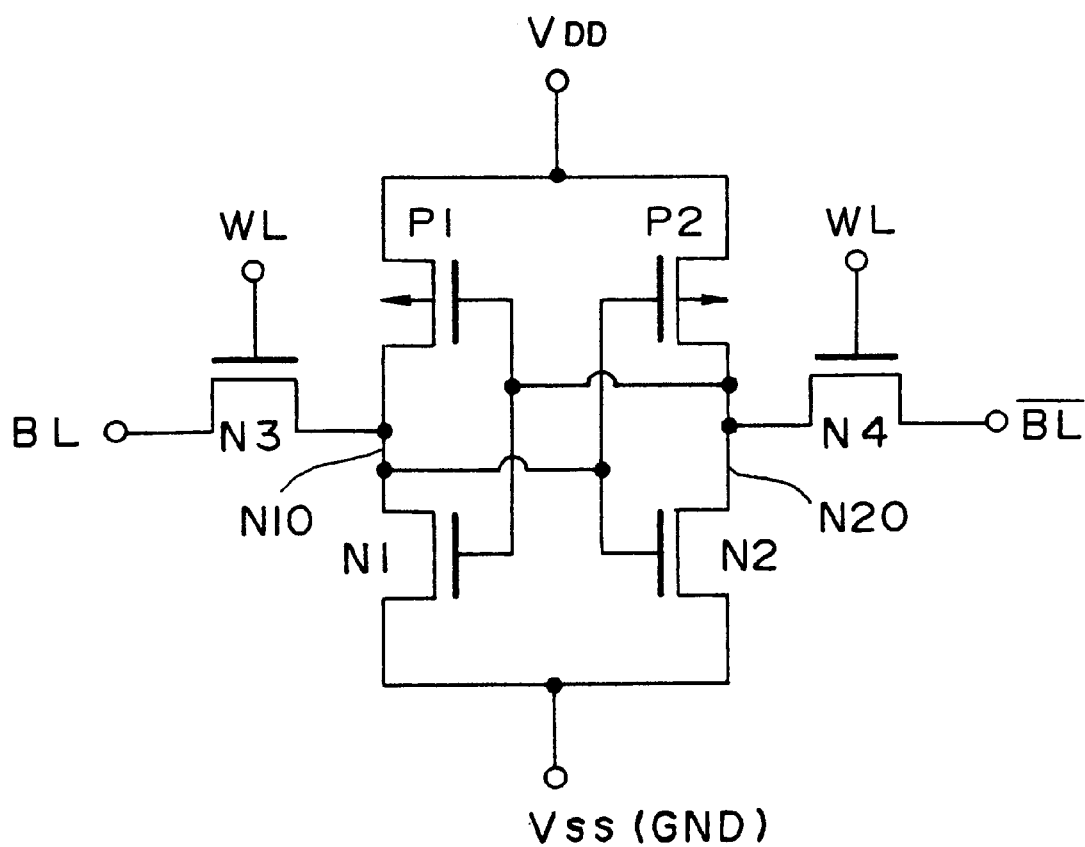
FIG. 2 shows an equivalent circuit of the SRAM cell indicated in FIG. 1.
Figure 3:
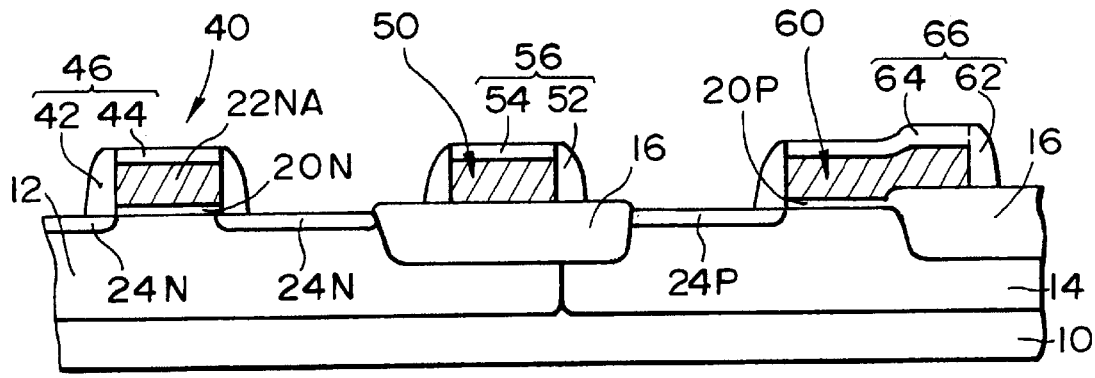
FIG. 3 is a partial sectional view of the SRAM cell indicated in FIG. 1, showing a manufacturing process.

FIG. 1 is a plan view showing a layout of a full CMOS SRAM cell (hereinafter referred to as "SRAM cell") in a preferred embodiment of the present invention, FIG. 2 shows an equivalent circuit of the SRAM cell, and FIGS. 3 to 9 show partial sectional views for explaining manufacturing process of the SRAM cell. In FIG. 1, an interlayer dielectric layer is omitted.

As shown in FIGS. 1 and 2, the SRAM cell in the present embodiment comprises a memory cell including six transistors. A pair of NMOS transistors (drive transistors) N1 and N2 and a pair of PMOS transistors (load transistors) P1 and P2 are interconnected to provide a flip-flop circuit.

In an N well 14, the source region of each of the paired load transistors P1 and P2 is formed to connect with a power supply $V_{DD}$. In a P well 12, the source region of each of the paired drive transistors N1 and N2 is formed to connect with a power supply (ground) $V_{SS}$. NMOS transistors (transfer transistors) N3 and N4 arranged as a pair are connected with nodes N10 and N20, respectively. One of the source and drain regions of the transfer transistors N3 and N4 is connected with a bit line $\overline{BL}$. Each gate electrode of the transfer transistors N3 and N4 is connected with a word line WL.

As shown in FIG. 1, in the SRAM cell in the present preferred embodiment, a first gate electrode layer (first wiring layer) 40 made of polysilicon is provided in common for a first load transistor 100PA (P1) and a first drive transistor 300NA (N1). A second gate electrode layer (second wiring layer) 60 made of polysilicon is provided in common for a second load transistor 200PB (P2) and a second drive transistor 400NB (N2). Further, a third gate electrode layer 80 made of polysilicon is provided in common for a first transfer transistor 500NC (N3) and a second transfer transistor 600ND (N4).

The first load transistor 100PA (P1) is provided with impurity diffusion layers 12a and 12b, each serving as a source/drain region (active region), on both sides of the first gate electrode layer 40, and the impurity diffusion layer (source region) 12a is connected with the power supply $V_{DD}$ via a contact part C1. The second load transistor 200PB (P2) has impurity diffusion layers 12c and 12d, each serving as a source/drain region, on both sides of the second gate electrode layer 60, and the impurity diffusion layer (source region) 12d is connected with the power supply $V_{DD}$ via a contact part C2.

The first drive transistor 300NA (N1) is provided with impurity diffusion layers 12e and 12f, each serving as a source/drain region, on both sides of the first gate electrode layer 40, and the impurity diffusion layer (source region) 12e is connected with the power supply $V_{SS}$ via a contact part C3. The second drive transistor 400NB (N2) is provided with impurity diffusion layers 12g and 12h, each serving as a source/drain region, on both sides of the second gate electrode layer 60, and the impurity diffusion layer (source region) 12h is connected with the power supply $V_{SS}$ via a contact part C4.

The first transfer transistor 500NC (N3) used for accessing is provided with impurity diffusion layers 12k and 12l, each serving as a source/drain region, on both sides of the third gate electrode layer 80, and the impurity diffusion layer 12l is connected with the bit line BL via a contact part C6. Similarly, the second transfer transistor 600ND (N4) is provided with impurity diffusion layers 12i and 12j, each serving as a source/drain region, on both sides of the third gate electrode layer 80, and the impurity diffusion layer 12j is connected with the bit line $\overline{BL}$ via a contact part C5.

In FIG. 1, part of the gate electrode layers 40, 60, and 80 that intersect the active regions function as gate electrodes 22PA, 22PB, 22NA, 22NB, 22NC, and 22ND.

In the present embodiment, a third wiring layer 50 connects the first gate electrode layer 40 with the drain region 12g of the second drive transistor 400NB (N2). The second gate electrode layer 60 connects the gate electrode 22NB of the second drive transistor 400NB (N2), the gate electrode 22PB of the second load transistor 200PB (P2), and the drain region 12b of the first load transistor 100PA (P1).

A fourth wiring layer 70A and a fifth wiring layer 70B are formed to interconnect CMOS drain regions. More specifically, the fourth wiring layer 70A connects the drain region 12b of the first load transistor 100PA (P1) with the drain region 12f of the first drive transistor 300NA (N1) via contact parts C7 and C8. The fifth wiring layer 70B connects the drain region 12c of the second load transistor 200PB (P2) with the drain region 12g of the second drive transistor 400NB (N2) via contact parts C9 and C10.

The third wiring layer 50 and the fourth wiring layer 70A are crossed in the layout, and are electrically isolated by a cover dielectric layer not shown in FIG. 1. The fourth wiring layer 70A is connected with the second gate electrode layer 60 via contact parts C7 and C11. The fifth wiring layer 70B is connected with the third wiring layer 50 via contact parts C10 and C12.

Though not shown in FIG. 1, the cover dielectric layer is formed on each of the first, second, and third gate electrode layers 40, 60, and 80, the third wiring layer 50, the fourth wiring layer 70A, and the fifth wiring layer 70B.

Figure 8:
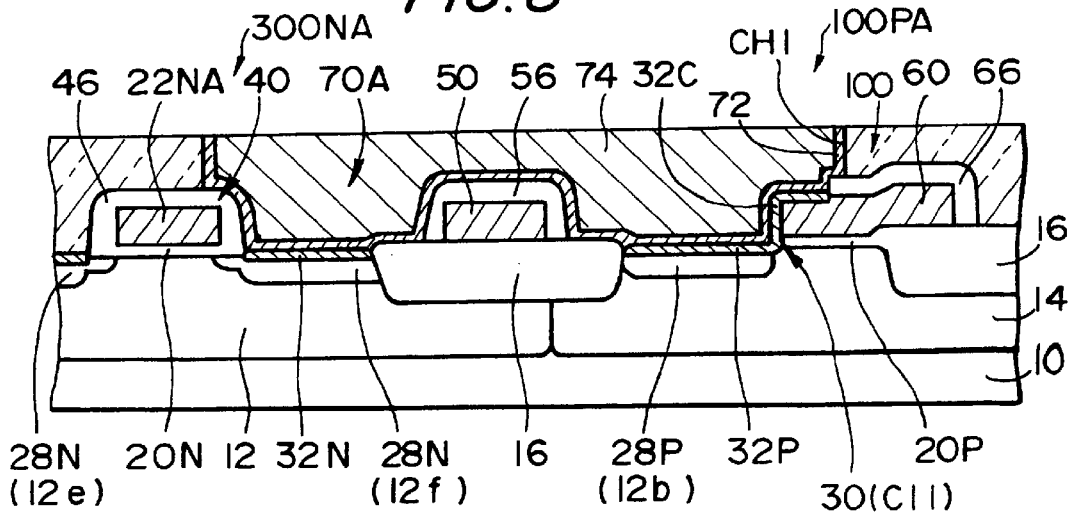
FIG. 8 is a partial sectional view of the SRAM cell indicated in FIG. 1, taken along the line A—A in FIG. 1, and showing a manufacturing process.
Figure 9:
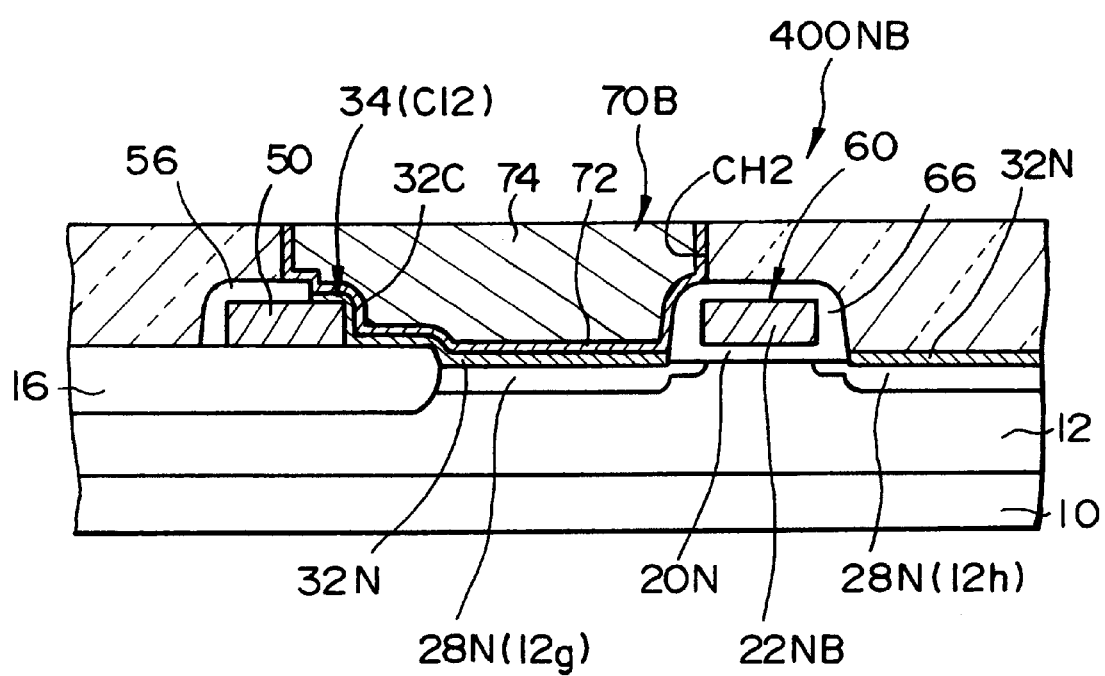
FIG. 9 is a partial sectional view of the SRAM cell indicated in FIG. 1, taken along the line B—B in FIG. 1, and showing a manufacturing process.

FIGS. 8 and 9 show particular features of the present embodiment. FIG. 8 is a sectional view taken along the line A—A in FIG. 1, and FIG. 9 is a sectional view taken along the line B—B in FIG. 1.

In the semiconductor device structure shown in FIGS. 1, 8, and 9, the P well 12 and the N well 14 are formed in a semiconductor substrate 10, and the surfaces of these wells are electrically isolated by a field oxide layer 16. Around the active region of the MOS transistor, there is also formed a field oxide layer 16.

In the P well 12, the first drive transistor 300NA and the second drive transistor 400NB are formed. As shown in FIG. 8, the first drive transistor 300NA has LDD-structure (lightly doped drain structure) N-type source/drain regions 28N (12e, 12f in FIG. 1), and a metallic silicide layer 32N is formed on the surface of each source/drain region 28N. Between the source/drain regions 28N and 28N, the gate electrode 22NA is formed via a gate dielectric layer 20N on the principal plane of the P well 12. A first cover dielectric layer 46 is formed continuously on the side and top surfaces of the first gate electrode layer 40 including the gate electrode 22NA.

As shown in FIG. 9, the second drive transistor 400NB has LDD-structure N-type source/drain regions 28N (12g, 12h in FIG. 1), and a metallic silicide layer 32N is formed on the surface of each source/drain region 28N. Between the source drain regions 28N and 28N, the gate electrode 22NB is formed via the gate dielectric layer 20N on the principal plane of the P well 12. A second cover dielectric layer 66 is formed continuously on the side and top surfaces of the second gate electrode layer 60 including the gate electrode 22NB.

On the other hand, in the N well 14, the first load transistor 100PA and the second load transistor 200PB are formed. As shown in FIG. 8, the first load transistor 100PA has LDD-structure P-type source/drain regions 28P (12b in FIG. 1), and a metallic silicide layer 32P is formed on the surface of each source/drain region 28P. Between the source/drain regions 28P and 28P, the gate electrode (22PA in FIG. 1) is formed via a gate dielectric layer.

As shown in FIG. 8, the second gate electrode layer 60 is formed on the surfaces of the field oxide layer 16 and dielectric layer 20P. On a part of the side surface of the second gate electrode layer 60 and a part of the top surface contiguous thereto, there is formed a first local wiring layer 30 (contact part C11 in FIG. 1) containing a metallic silicide layer 32C contiguous to the metallic silicide layer 32P. The second cover dielectric layer 66 is formed on the side and top surfaces of the second gate electrode layer 60 in a region other than the first local wiring layer 30.

As shown in FIGS. 8 and 9, the third wiring layer 50 is formed on the top surface of the field oxide layer 16 including an interface between the P well 12 and the N well 14. On the side and top surfaces of the third wiring layer 50, a third cover dielectric layer 56 is formed.

As shown in FIG. 8, in a first interlayer dielectric layer 100, a first contact hole CH1 is formed in such a manner that at least a part of each of the source/drain region 28N (drain region 12f), third cover dielectric layer 56 and source/drain region 28P (drain region 12b) is exposed. In the contact hole CH1, the fourth wiring layer 70A comprising a barrier layer 72 and a conductive layer 74 made of metal, metal alloy or silicon is provided. In the present preferred embodiment, the fourth wiring layer 70A is formed so as to include the parts corresponding to the contact parts C7 and C8 indicated in FIG. 1.

Similarly, as shown in FIG. 9, in the first interlayer dielectric layer 100, a second contact hole CH2 is formed in such a manner that at least a part of each of the source/drain region 28N (drain region 12g) and source/drain region 28P (drain region 12c) is exposed. In the contact hole CH2, the fifth wiring layer 70B containing the barrier layer 72 and the metallic conductive layer 74 is provided. The fifth wiring layer 70B is formed so as to include the parts corresponding to the contact parts C9 and C10 indicated in FIG. 1.

In the semiconductor device structured as mentioned above, as shown in FIG. 8, the source/drain region 28P (12b) of the first load transistor 100PA and the second gate electrode layer 60 are connected directly (not via a contact hole) by the first local wiring layer 30 (contact part C11 in FIG. 1) containing the metallic silicide layer 32C formed self-alignably. This arrangement makes it possible to realize finer wiring patterns. The third wiring layer 50 and the fourth wiring layer 70A are electrically isolated by the third cover dielectric layer 56 formed around the third wiring layer 50.

Further, as shown in FIG. 9, the drain region 12g of the second drive transistor 400NB (N2) and the third wiring layer 50 are directly connected by a second local wiring layer 34 (contact part C12 in FIG. 1) containing the self-alignably formed metallic silicide layer 32C in the same manner as with the contact part C11. This arrangement also contributes to implementation of finer wiring patterns.

Semiconductor manufacturing process

The following describes a method of manufacturing SRAM cell according to the present invention with reference to FIGS. 3 to 9. FIGS. 3 to 8 show partial sectional views of the SRAM cell, taken along the line A—A in FIG. 1.

(a) First, an N well 14 and a P well 12 are formed in a P-type silicon substrate 10, and a field oxide layer 16 is formed to surround an active region on which transistors are to be provided. The surfaces of the N well 14 and P well 12, which are exposed in the active region, are then thermally oxidized to form a dielectric layer.

Then, using such methods as chemical vapor deposition (CVD), ion implantation, and thermal diffusion, a polysilicon layer doped with N-type or P-type impurities is formed on the dielectric layer mentioned above. Further, an upper dielectric layer made of a substance such as silicon oxide or silicon nitride is deposited on the polysilicon layer by the CVD method or the like. Thereafter, these dielectric layer, doped polysilicon layer and upper dielectric layer are patterned by means of photolithography to provide gate dielectric layers 20N and 20P, a first wiring layer (first gate electrode layer) 40, a third wiring layer 50, a second wiring layer (second gate electrode layer) 60, and a third gate electrode layer (80) not shown in FIG. 3 (refer to FIG. 1). Further, upper dielectric layers 44, 54 and 64 are formed on the wiring layers 40, 50 and 60. Similarly, an upper dielectric layer (not shown) is also formed on the wiring layer 80.

Then, phosphorous or boron ions are implanted to form low-concentration impurity diffusion layers 24N and 24P for arranging an LDD structure. Thus, the impurity diffusion regions are provided by means of doping. Further, after a dielectric layer made of a substance such as silicon oxide or silicon nitride is deposited by the CVD method, the entire surface thereof is etched by means of dry-etching such as reactive ion etching (RIE) to form side wall dielectric layers 42, 52 and 62 on the side walls of the wiring layers 40, 50 and 60, respectively. The side wall dielectric layers 42, 52 and 62, and the upper dielectric layers 44, 54, and 64 are arranged to form first, third and second cover dielectric layers 46, 56 and 66 for continuously covering the wiring layers 10, 50 and 60, respectively. In the same manner, a fourth cover dielectric layer (not shown) is formed on the surface of the third gate electrode layer 80.

In patterning of a fourth wiring layer 70A to be described later, at least the first cover dielectric layer 46 and the third cover dielectric layer 56 serve as masking layers, and in patterning of a fifth wiring layer 70B to be described later, at least the second cover dielectric layer 66 serves as a masking layer.

Figure 4:
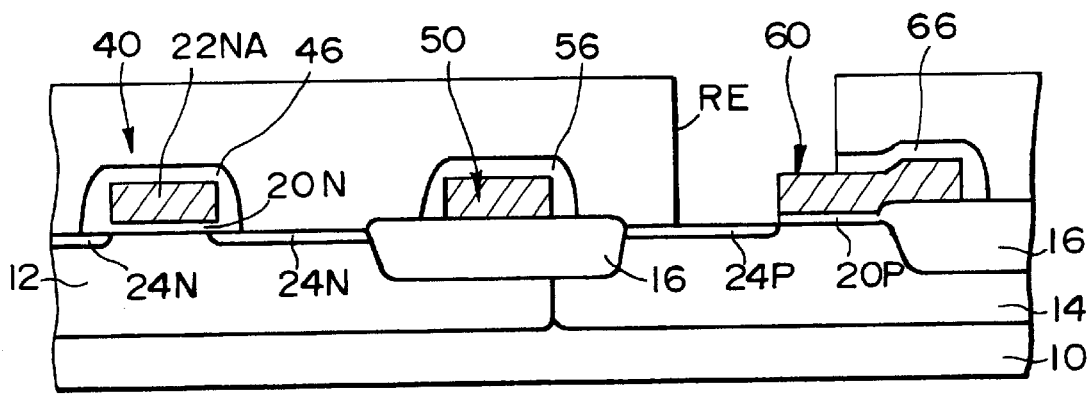
FIG. 4 is a partial sectional view of the SRAM cell indicated in FIG. 1, showing a manufacturing process.

(b) Then, as shown in FIG. 4, a resist layer RE having an opening (corresponding to the region where the contact part C1 indicated in FIG. 1 is provided) is formed to remove a part of the second cover dielectric layer 66 disposed on the side and top surfaces of the second wiring layer 60 adjacent to the P-type impurity diffusion layer 24P. Thereafter, predetermined side and top areas of the cover dielectric layer on the second wiring layer 60 are removed by means of dry-etching such as RIE. At this step, though not shown in FIG. 4, an opening is formed in the region corresponding to the contact part C12 indicated in FIG. 1, and predetermined side and top areas of the cover dielectric layer on the third wiring layer 50 are also removed.

Figure 5:
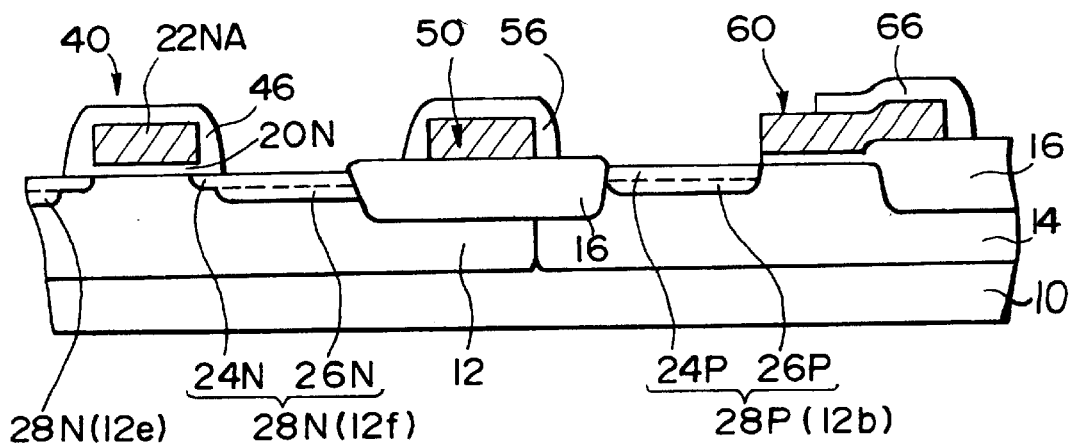
FIG. 5 is a partial sectional view of the SRAM cell indicated in FIG. 1, showing a manufacturing process.

(c) Then, as shown in FIG. 5, by using the dielectric layers 46, 56, and 66 formed on the wiring layers 40, 50 and 60, the dielectric layer formed on the third gate electrode layer (not shown), and the field oxide layer 16 as masking layers, high-concentration N-type impurities such as phosphorus and arsenic are introduced into the active region of the P well 12, and high-concentration P-type impurities such as boron are introduced into the active region of the N well 14. Thus, LDD-structure source/drain regions 28N (12e, 12f in FIG. 1) and 28P (12b in FIG. 1) are formed.

Figure 6:
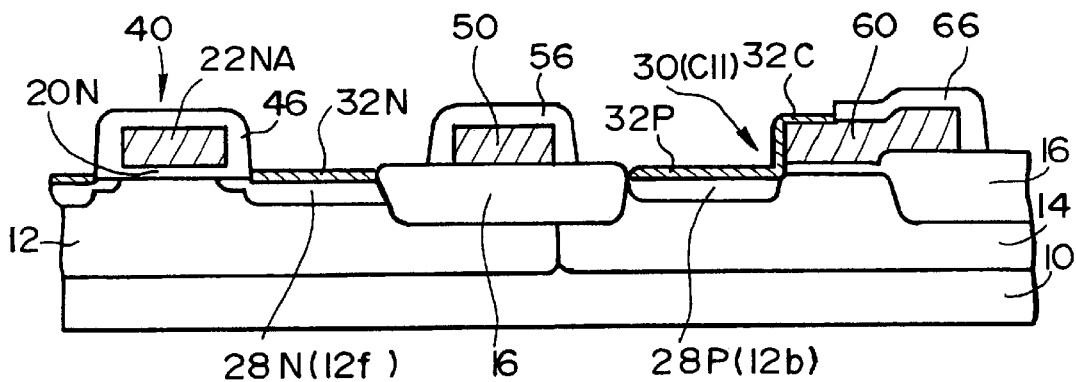
FIG. 6 is a partial sectional view of the SRAM cell indicated in FIG. 1, showing a manufacturing process.

(d) Then, as shown in FIG. 6, metallic silicide layers 32N, 32P, and 32C are formed on the exposed surfaces of the source/drain regions 28N and 28P and the second wiring layer 60 by using a salicide processing technique. The metallic silicide layer 32C formed on the exposed surface of the second wiring layer 60 serves as a first local wiring layer 30 for connecting the second wiring layer 60 with the source/drain region 28P (12b). Further, as shown in FIG. 9, the source/drain region 28N (12g) of the second drive transistor 400NB and the third wiring layer 50 are connected by a second local wiring layer 34 configured with the metallic silicide layer 32C (contact part C12 in FIG. 1).

For metallic silicide layer formation, a proper metallic film comprising a substance selected from the group of titanium, cobalt, tungsten and nickel, for example, is formed to a thickness from 5 to 100 nm by means of sputtering, and then rapid thermal annealing (RTA) is carried out at a temperature of 700 to 730° C. Thus, a metallic substance of the abovementioned metallic film is alloyed with silicon to form a metallic silicide layer between the metallic film and each of the exposed surfaces of the source/drain regions 28N and 28P, the second wiring layer 60 and the third wiring layer 50 containing silicon.

Thereafter, for example, the etching is performed at a temperature of approx. 50 to 70° C. for a period of approximate 5 to 60 minutes by using an etchant comprising principal constituents of ammonia and hydrogen peroxide. Thus, an unreacted metallic film is removed. This results in the metallic silicide layers 32N, 32P and 32C being formed on the exposed surfaces of the source/drain regions 28N and 28P, the second wiring layer 60 and the third wiring layer 50. Besides the etchant indicated above, an etchant made by adding hydrogen peroxide to sulfuric acid or hydrochloric acid may be used according to the properties of the unreacted metal. Then, thermal treatment is performed to make the thus formed metallic silicide layers stable. For example, the thermal treatment is carried out at a temperature of approx. 750 to 850° C. for aperiod of approximate 5 to 60 seconds.

Figure 7:
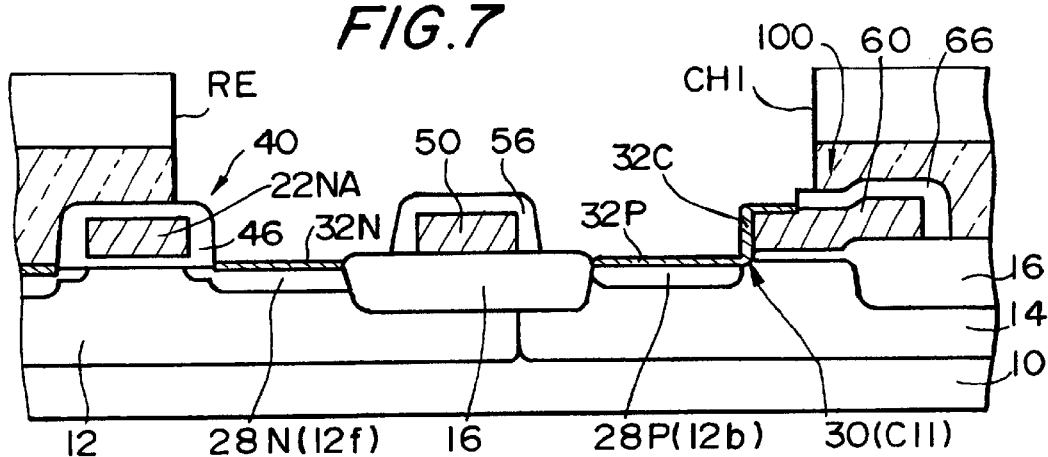
FIG. 7 is a partial sectional view of the SRAM cell indicated in FIG. 1, showing a manufacturing process.

(e) Then, as shown in FIG. 7, a dielectric layer made of a substance such as phosphosilicate glass (PSG) is formed on the surface of the substrate by the CVD method or the like, and the dielectric layer thus formed is planarized by means of chemical mechanical polishing (CMP) as required. Thus, an interlayer dielectric layer 100 having a film thickness from 0.1 to 0.5 µm is provided. Then, to form a contact hole in a predetermined region, a resist layer RE is formed by photolithographic patterning. In particular, as shown in FIG. 7, a first contact hole CH1 is formed so that at least the source/drain region 28N (12*f*), the third wiring layer 30 and the source/drain region 28P (12*b*) are exposed. Since the first cover dielectric layer 46 and the third cover dielectric layer 56 are formed on the surfaces of the first wiring layer 40 and the third wiring layer 50, the first contact hole CH1 for the fourth wiring layer 70A can be formed by using at least these cover dielectric layers 46 and 56 as masking layers. Therefore, without taking an alignment error into account, it is possible to self-alignably form a contact hole. Namely, since particular consideration need not be given to an alignment error, an increase in wiring density can be realized. Similarly, as shown in FIG. 9, a second contact hole CH2 for the fifth wiring layer 70B can be formed by using at least the second cover dielectric layer 66 as a masking layer.

(f) Then, as shown in FIG. 8, a barrier layer 72 and a conductive layer 74 are formed in the contact holes CH1 and CH2 respectively by means of sputtering. Thereafter, the surfaces of the fourth wiring layer 70A and the fifth wiring layer 70B comprising the barrier layer 72 and conductive layer 74 in the contact holes CH1 and CH2 are planarized by etch-back processing or CMP. The barrier layer 72 preferably comprises a metallic substance selected from the group consisting of titanium, tungsten, cobalt and nickel, for example, or the barrier layer 72 preferably comprises a nitride thereof or a lamination of films composed of such substances. The conductive layer 74 preferably has a small electrical resistance and is stable under thermal treatment at high temperature, e.g., a refractory metal such as tungsten or molybdenum, silicide thereof, metal such as aluminum, aluminum-copper alloy, copper, platinum, or gold, and a conductive substance mainly composed of silicon.

The process steps mentioned above can be carried out by common methods of manufacturing semiconductor device.

As set forth hereinabove and according to the semiconductor device manufacturing method of the present invention, it is possible to self-alignably form the first local wiring layer 30 (contact part C11 in FIG. 1) and the second local wiring layer 34 (contact part C12 in FIG. 1) by using the salicide processing technique as shown in FIG. 6, the first contact hole CH1 for the fourth wiring layer 70A as shown in FIGS. 7 and 8, and the second contact hole CH2 for the fifth wiring layer 70B as shown in FIG. 9. Therefore, an increase in wiring density can be achieved without consideration of an alignment error in mask formation. Thus, the present invention can provide a semiconductor device having a higher wiring density for improvement of microstructure integration.

What is claimed is:

1. A semiconductor device which comprises a memory cell including first and second load transistors, first and second drive transistors and two transfer transistors, said semiconductor device comprising:

a first wiring layer for connecting a gate electrode of said first load transistor with a gate electrode of said first drive transistor, formed on an active region and an element isolation region, with a dielectric layer interposed;

a first cover dielectric layer for continuously covering side and top surfaces of said first wiring layer;

a first impurity diffusion layer of a first conductive type that is a part of said first load transistor, and a second impurity diffusion layer of a second conductive type that is a part of said first drive transistor, both of which are formed in the active region;

a second wiring layer for connecting a gate electrode of said second load transistor with a gate electrode of said second drive transistor, formed on said active region and element isolation region, with a dielectric layer interposed, apart from said first wiring layer;

a second cover dielectric layer for continuously covering side and top surfaces of said second wiring layer;

a third impurity diffusion layer of the first conductive type that is a part of said second load transistor, and a fourth impurity diffusion layer of the second conductive type that is part of said second drive transistor, both of which are formed in the active region;

a third wiring layer for connecting said first wiring layer with said fourth impurity diffusion layer, at least apart of said third wiring layer being disposed on said element isolation region;

a third cover dielectric layer for continuously covering side and top surfaces of said third wiring layer;

a first local wiring layer for connecting said first impurity diffusion layer with said second wiring layer;

a second local wiring layer for connecting said fourth impurity diffusion layer with said third wiring layer;

an interlayer dielectric layer including:

a first contact hole which exposes a semiconductor substrate including at least a part of each of said first impurity diffusion layer, third cover dielectric layer, element isolation region, and second impurity diffusion layer; and a second contact hole which exposes said semiconductor substrate including at least a part of each of said third impurity diffusion layer, element isolation region, and fourth impurity diffusion layer;

a fourth wiring layer for connecting said first impurity diffusion layer with said second impurity diffusion layer, formed in the first contact hole; and a fifth wiring layer for connecting said third impurity diffusion layer with said fourth impurity diffusion layer, formed in said second contact hole.

2. The semiconductor device as defined in claim 1, wherein said first, second, and third wiring layers contain silicon.

3. The semiconductor device as defined in claim 1, wherein said first local wiring layer comprises a metallic silicide layer formed on partial surfaces of said first impurity diffusion layer and said second wiring layer.

4. The semiconductor device as defined in claim 1, wherein said second local wiring layer comprises a metallic silicide layer formed on partial surfaces of said fourth impurity diffusion layer and said third wiring layer.

5. The semiconductor device as defined in claim 1, wherein each of said first and second wiring layers is a gate wiring layer in a CMOS structure.

6. The semiconductor device as defined in claim 1, wherein said third wiring layer is formed contiguously with said first wiring layer in an integral configuration.

7. The semiconductor device as defined in claim 1, wherein a wiring layer comprising said first and third wiring layers is arranged to provide a plane configuration similar to a shape "h", and said second wiring layer is arranged to provide a plane configuration similar to a shape "7".

* * * * *